(12) United States Patent
Ahn (10) Patent No.: US 8,804,391 B2
(45) Date of Patent: Aug. 12, 2014

(54) SEMICONDUCTOR MEMORY DEVICE AND METHOD OF OPERATING THE SAME

(75) Inventor: Sung Hoon Ahn, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 148 days.

(21) Appl. No.: 13/528,204

(22) Filed: Jun. 20, 2012

(65) Prior Publication Data

US 2013/0051145 A1 Feb. 28, 2013

(30) Foreign Application Priority Data

Aug. 31, 2011 (KR) ........................ 10-2011-0087669

(51) Int. Cl.
*G11C 15/04* (2006.01)
*G11C 15/00* (2006.01)

(52) U.S. Cl.
CPC ................ *G11C 15/04* (2013.01); *G11C 15/00* (2013.01); *G11C 15/046* (2013.01); *G11C 15/043* (2013.01)
USPC .................... 365/49.1; 365/120; 365/185.11; 365/23.03

(58) Field of Classification Search
CPC ...... G11C 15/04; G11C 15/00; G11C 15/046; G11C 15/043
USPC .......................... 365/49.1, 120, 185.11, 23.03
See application file for complete search history.

(56) References Cited

U.S. PATENT DOCUMENTS

2004/0190357 A1 * 9/2004 Scheuerlein et al. ......... 365/222

* cited by examiner

*Primary Examiner* — Jason Lappas
(74) *Attorney, Agent, or Firm* — IP & T Group LLP (57) ABSTRACT

A semiconductor memory device includes memory blocks that each include memory cells coupled to bit lines, a column masking circuit configured to output data change signals in response to an address signal indicating bit lines of selected columns among a plurality of columns, and an operation circuit configured to store data of the memory cells transferred through the bit lines and simultaneously change data transferred through the bit lines of the selected columns into operation pass data in response to the data change signals.

10 Claims, 7 Drawing Sheets

SEMICONDUCTOR MEMORY DEVICE AND METHOD OF OPERATING THE SAME

CROSS-REFERENCE TO RELATED APPLICATION

Priority is claimed to Korean patent application number 10-2011-0087669 filed on Aug. 31, 2011, the entire disclosure of which is incorporated herein by reference in its entirety.

BACKGROUND

1. Field of Invention

Exemplary embodiments of the present invention relate to a semiconductor memory device and a method of operating the same and, more particularly, to a semiconductor memory device having a plurality of memory cells coupled to bit lines and a method of operating the same.

2. Description of Related Art

Memory cells are coupled to bit lines, and data are input to or output from the memory cells through the bit lines. In a NAND flash memory device, page buffers sense data from memory cells or store data in the memory cells through bit lines. When 2-bit data consisting of least significant bit (LSB) data and most significant bit (MSB) data are stored in a single memory cell, a page buffer may include two latch circuits composed of a cache latch circuit and a main latch circuit that latch the LSB data and the MSB data, respectively. After a program operation is performed to store data, an operation (e.g., a program verify operation) of checking a status of the stored data is performed.

In order for invalid columns having defective memory cells or unused redundancy memory cells not to affect a status check operation such as a program verify operation, data (e.g., user data) may be input after a default value of the cache latch circuit is set to 1. When LSB data of '1' is inputted, a memory cell is sensed as being in an erase status. Therefore, an invalid column may be sensed as being in a pass status and does not affect the status check operation. In an MSB program operation that stores MSB data, when the MSB data is input as '1', both LSB data and MSB data are '1'. A threshold voltage level of a memory cell is determined depending on the LSB data and MSB data. Therefore, the memory cell has a threshold voltage of less than 0 V, that is, an erase status, and the invalid column may be sensed as being in a pass status during a status check operation without being programmed.

However, when the threshold voltage of the defective memory cell among the memory cells is higher than 0 V and does not decrease, the LSB data of the defected memory cell may be sensed as '0'. Thus, even when the data is input as '1', a program operation does not change the threshold voltage of the defective memory cell. As a result, a program operation is sensed as being incomplete during the status check operation such as a program verify operation.

For these reasons, there has been a demand for a method of precluding a program operation from being sensed as being a fail status due to defective memory cells during a status check operation.

BRIEF SUMMARY

Exemplary embodiments relate to a semiconductor memory device prevented from being sensed as having program fail due to defective memory cells during a status check operation by simultaneously changing data latched in page buffers of invalid columns coupled to the defective memory cells or redundancy cells, which are not used for a program operation, through bit lines into operation pass data.

A semiconductor memory device according to an embodiment of the present invention includes memory blocks that each include memory cells coupled to bit lines, a column masking circuit configured to output data change signals in response to an address signal indicating bit lines of unused columns among a plurality of columns, and an operation circuit configured to store data of the memory cells transferred through the bit lines and simultaneously change data transferred through the bit lines of the selected columns into operation pass data in response to the data change signals.

A semiconductor memory device according to another embodiment of the present invention includes memory blocks that each include memory cells coupled to bit lines, page buffers configured to control respective voltages of the bit lines to store data in the memory cells and latch the data stored in the memory cells by sensing the voltages of the bit lines, a column masking circuit configured to store column data for differentiating selected columns from other columns and output data change signals in response to the column data, and a column selector configured to change data latched in page buffers of the selected columns into operation pass data in response to the data change signals and selectively transfer the data latched in the page buffers to data lines in response to address signals.

A method of operating a semiconductor memory device according to an embodiment of the present invention includes latching column data for indicating a selected column of a plurality of columns, latching data sensed from memory cells, changing data sensed from memory cells of the selected column into operation pass data in response to the column data, and checking whether the memory cells are programmed or not by using data sensed from memory cells of remaining columns and the operation pass data.

DESCRIPTION OF EMBODIMENTS

Hereinafter, various embodiments of the present disclosure will be described in detail with reference to the accompanying drawings. The figures are provided to enable those of ordinary skill in the art to make and use the present invention according to the exemplary embodiments of the present invention.

Figure 1:
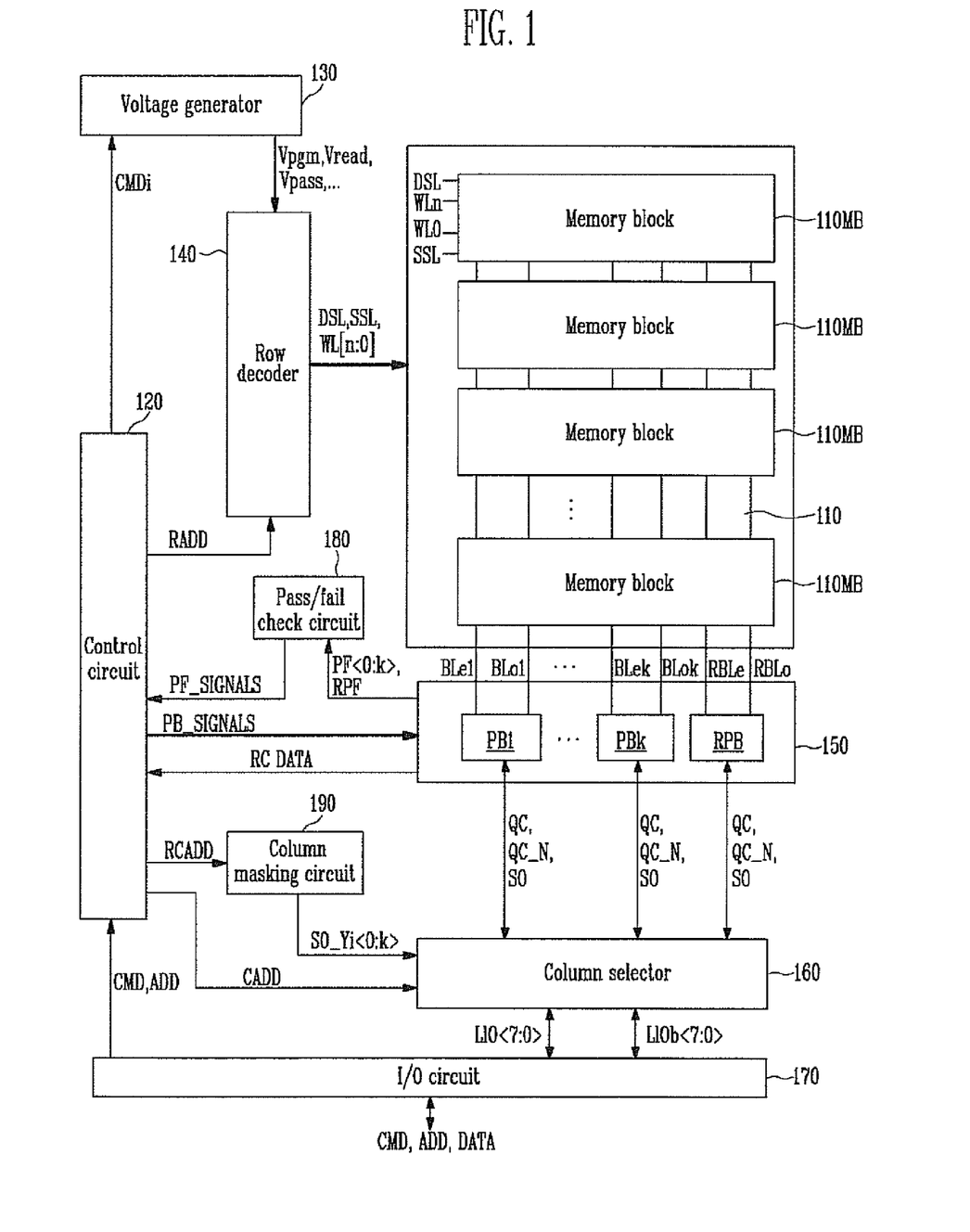
FIG. 1 is a block diagram of a semiconductor memory device according to an embodiment of the present invention.
Figure 2:
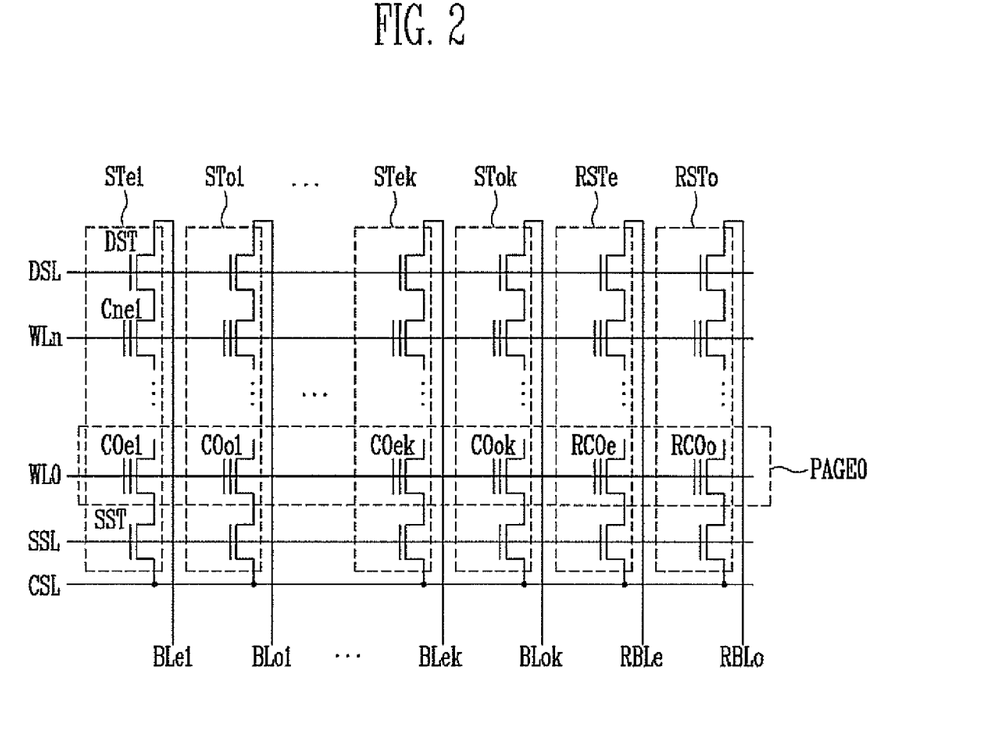
FIG. 2 is a circuit diagram of a memory block shown in FIG. 1.

FIG. 1 is a block diagram of a semiconductor memory device according to an embodiment of the present invention. FIG. 2 is a circuit diagram of a memory block shown in FIG. 1.

Referring to FIG. 1, a semiconductor memory device according to an embodiment of the present invention includes a memory array 110 having a plurality of memory blocks 110MB, operation circuits 130 to 180 configured to perform a program operation, a read operation, and an erase operation for data input and output of memory cells included in selected pages of the memory blocks 110MB, a column masking circuit 190, and a control circuit 120 configured to control the operation circuits 130 to 180 and the column masking circuit 190. A NAND flash memory device includes operation circuits composed of power supply circuits 130 and 140, a page buffer group 150, a column selector 160, an I/O circuit 170, and a pass/fail check circuit 180.

The column masking circuit 190 is configured to output data change signals SO_Yi<0:k> to change data output from memory cells through bit lines of unused columns among the entirety of columns. The operation circuits 130 to 180 are configured to sense the data stored in the memory cells through the bit lines, latch the sensed data, and simultaneously change the data latched and sensed through the bit lines of the unused columns into operation pass data in response to the data change signals SO_Yi<0:k>. A detailed description of the column masking circuit 190 will be made below.

The memory array 110 includes the plurality of memory blocks 110MB. At least one of the memory blocks 110MB is used as a CAM block configured to store configuration information including a repaired column address for differentiating unused columns from other columns. The CAM block has the same configuration as the memory block 110MB. The configuration of the memory blocks MB is described below in detail.

Referring to FIG. 2, each of the memory blocks 110MB includes a plurality of strings STe1 to STek, STo1 to STok, RSTe, and RSTo that are coupled between bit lines BLe1 to BLek, BLo1 to BLok, RBLe, and RBLo and a common source line CSL. More specifically, the strings STe1 to STek, STo1 to STok, RSTe, and RSTo are coupled to the bit lines BLe1 to BLek, BLo1 to BLok, RBLe, and RBLo, respectively, and are coupled to the common source line CSL in common. Each of the strings, for example, the string STe1 includes a source select transistor SST having a source coupled to the common source line CSL, a plurality of memory cells C0e1 to Cne1, and a drain select transistor DST having a drain coupled to the bit line BLe1. The memory cells C0e1 to Cne1 are coupled in series between the source and drain select transistors SST and DST. A gate of the source select transistor SST is coupled to a source select line SSL, gates of the memory cells C0e1 to Cne1 are coupled to word lines WL0 to WLn, respectively, and a gate of the drain select transistor DST is coupled to a drain select line DSL.

Among the plurality of strings, the redundancy strings RSTe and RSTo coupled between the redundancy bit lines RBLe and RBLo and the common source line CSL include redundancy cells RC0e and RC0o, respectively, in order to replace defective memory cells included in the memory strings STe1 to STek and STo1 to STok. The number of redundancy strings RSTe and RSTo may vary depending on the number of defective memory cells or it may vary for different design needs.

Unused columns may include columns in which defective memory cells are located and columns in which unused redundancy cells are located. Configuration information including a repaired column address for differentiating the unused columns from other columns is stored in the CAM block.

In a NAND flash memory device, the memory cells included in the memory blocks may be divided into physical pages or logical pages. For example, the memory cells C0e1 to C0ek, C0o1 to C0ok, RC0e, and RC0o coupled to the word line WL0 form a single physical page PAGE0. In addition, even-numbered memory cells C0e1 to C0ek and RC0e coupled to the word line WL0 form a single even physical page, while odd-numbered memory cells C0ek to C0ok and RC0o coupled to the word line WL0 form a single odd physical page. The page (or an even page and an odd page) is the basic unit for the program operation or the read operation.

The word lines WL0 to WLn may be divided into at least two word line groups. For example, when sixty four word lines are provided, one word line group may consist of two, four, eight, sixteen, or thirty two word lines. Alternatively, a single word line group may consist of a single word line. In this case, the world line group is the same as the word line. A word line group to be described below may be replaced by a word line.

Referring to FIGS. 1 and 2, the control circuit 120 outputs an internal command signal CMDi and PB control signals PB_SIGNALS. The internal command signal CMDi is output to control a voltage generator 130 for data input and output in response to a command signal CMD that is externally input through the I/O circuit 170. The PB control signals PB_SIGNALS are output to control page buffers PB1 to PBk and RPB included in the page buffer group 150. In addition, the control circuit 120 outputs a column address signal CADD and a row address signal RADD in response to an address signal ADD. The row address signal RADD is output in order to differentiate a selected memory block from unselected memory blocks, while the column address signal CADD is output in order to select the page buffers PB1 to PBk and RPB of the page buffer group 150 in a sequential manner.

In particular, when the page buffers PB1 to PBk and RPB output configuration information RC DATA read from the CAM block, the control circuit 120 outputs a repaired column address RCADD to the column masking circuit 190 in response to the configuration information RC DATA. The column masking circuit 190 stores column data in response to the repaired column address RCADD and outputs the data change signals SO_Yi<0:k> in response to the stored column data. A detailed description thereof will be described below.

The power supply circuits 130 and 140 apply operating voltages (Vpgm, Vpass, Vread, etc.) for data input and output of the memory cells to local lines (e.g., DSL, WL0 to WLn, and SSL) of a selected memory block in response to the internal command signal CMDi of the control circuit 120. The power supply circuits 130 and 140 are composed of a voltage generator 130 and a row decoder 140.

The voltage generator 130 outputs operating voltages (Vpgm, Vpass, Vread, etc.) for data input and output of memory cells to global lines in response to the internal command signal CMDi of the control circuit 120. For example, during the program operation, the voltage generator 130 outputs a program voltage Vpgm to a global line to be coupled to a selected local word line and a program pass voltage Vpass to global lines to be coupled to unselected local word lines. In addition, during a read operation, the voltage generator 130 outputs a read voltage Vread to the global line to be coupled to the selected local word line and a read pass voltage Vpass to the global lines to be coupled to the unselected local word lines. The program voltage Vpgm may increase by stages during the program operation using an Increment Step Pulse Program (ISPP) method. The read voltage Vread may be applied at various levels during the read operation of 2-bit data stored in a single memory cell. In addition, a level of the program pass voltage may be higher than that of the read pass voltage.

The row decoder 140 couples the global lines to the local lines DSL, WL0 to WLn, and SSL of the memory block 110MB selected from the memory array 110 in response to the row address signals RADD from the control circuit 120 so that the operating voltages output to the global lines from the voltage generator 130 may be transferred to the local lines DSL, WL0 to WLn, and SSL of the selected memory block 110MB.

The page buffer group 150 includes the plurality of page buffers PB1 to PBk and RPB that are coupled to the memory array 110 through the bit lines BLe1 to BLek, BLo1 to BLok, RBLe, and RBLo. In response to the PB control signals PB_SIGNALS of the control circuit 120, the page buffers PB1 to PBk and RPB of the page buffer group 150 selectively precharge the bit lines BLe1 to BLek and RBLe, or BLo1 to BLok and RBLo depending on data to be stored in the memory cells C0e1 to C0ek and RC0e, or C0o1 to C0ok and RC0o, or sense voltages of the bit lines BLe1 to BLek and RBLe, or BLo1 to BLok and RBLo in order to read the data from the memory cells C0e1 to C0ek and RC0e, or C0o1 to C0ok and RC0o.

The column selector 160 selects the page buffers PB1 to PBk and RPB included in the page buffer group 150 in response to the column address CADD. That is, the column selector 160 transfers the data to be stored in the memory cells to the page buffers PB1 to PBk and RPB sequentially in response to the column address CADD during the program operation. In addition, the column selector 160 sequentially selects the page buffers PB1 to PBk and RPB in response to the column address CADD so as to externally output the data of the memory cells latched in the page buffers PB1 to PBk and RPB during the read operation. The column selector 160 may select the page buffer RPB reading data from the redundancy cells replacing the defective memory cells instead of the page buffer of the column having the defective memory cells located therein.

In particular, the column selector 160 functions to change data latched in page buffers of unused columns into operation pass data, which will be described below in more detail.

The I/O circuit 170 transfers data to the column selector 160 under control of the control circuit 120 so that the externally input data may be input to the page buffer group 150 to thereby store the data in the memory cells during the program operation. When the column selector 160 transfers the data transferred from the I/O circuit 170 to the page buffers PB1 to PBk and RPB of the page buffer group 150 as described above, the page buffers PB1 to PBk and RPB store the data in internal latch circuits. In addition, during the read operation, the I/O circuit 170 externally outputs the data transferred from the page buffers PB1 to PBk and RPB of the page buffer group 150 through the column selector 160.

The pass/fail check circuit 180 outputs a pass/fail signal PF_SIGNAL in response to verifying result data PF<0:k> and RPF output from the page buffers PB1 to PBk and RPB, respectively, during a status check operation such as a verify operation. More specifically, after a verify voltage is applied to the selected word line group during the verify operation, voltages of the bit lines are sensed, and the verifying result data PF<0:k> and RPF are latched in the internal latch circuits of the page buffers PB1 to PBk and RPB in response to the sensed voltages of the bit lines. The verifying result data PF<0:k> and RPF are output to the pass/fail check circuit 180. The pass/fail check circuit 180 outputs the pass/fail signal PF_SIGNAL indicating a status of the performed operation to the control circuit 120 in response to the verifying result data PF<0:k> and RPF. The control circuit 120 checks the status of each of the memory cells in response to the pass/fail signal PF_SIGNAL. When the number of abnormal cells (e.g., cells having not completed the program operation) exceeds a set value, the control circuit 120 may control the operation circuits 130 to 180 to repeat the program operation.

Figure 3:
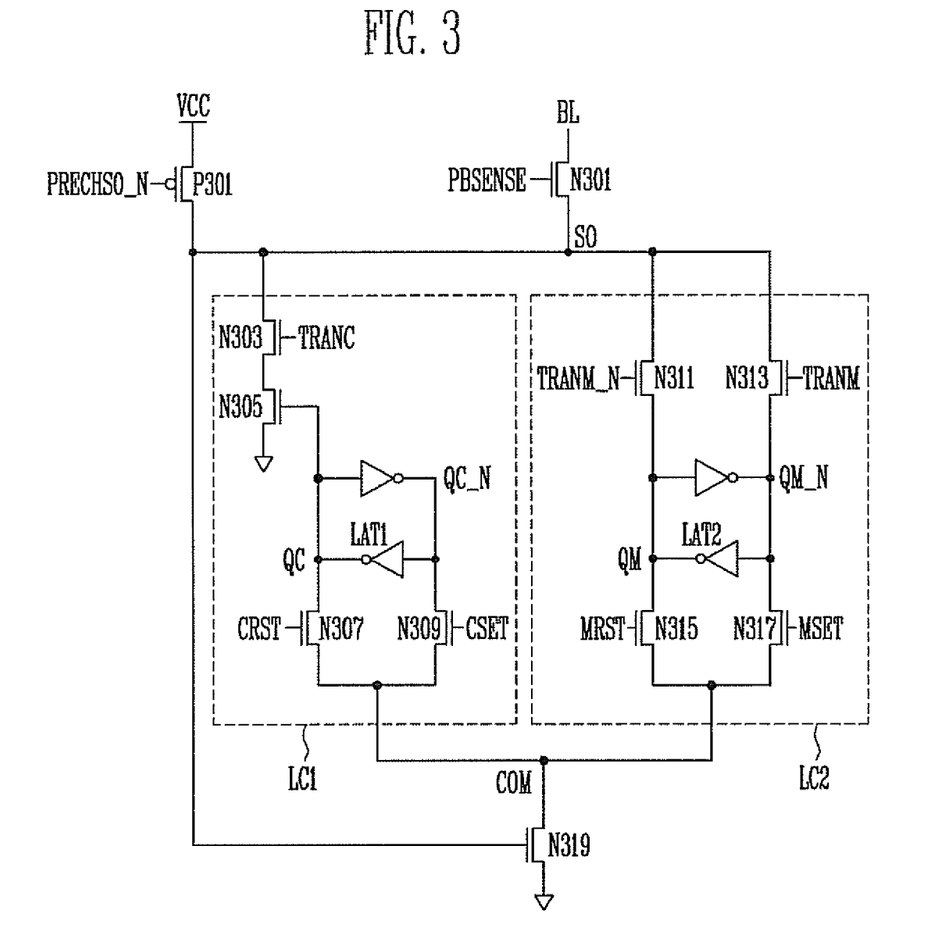
FIG. 3 is a circuit diagram of a page buffer shown in FIG. 1.

FIG. 3 is a circuit diagram of the page buffer shown in FIG. 1.

Referring to FIG. 3, each of the page buffers includes a plurality of latch circuits, for example, a first latch circuit LC1 and a second latch circuit LC2. The first latch circuit LC1 may serve as a cache latch circuit, while the second latch circuit LC2 may serve as a main latch circuit. A connecting point of the first and second latch circuits LC1 and LC2 becomes a sensing node SO. A transistor N301 that operates in response to a bit line coupling signal PBSENSE is coupled between the sensing node SO and a bit line BL. A transistor P301 is coupled between a power supply terminal VCC and the sensing node SO and configured to precharge the sensing node SO in response to a precharge control signal PRECHSO_N. A transistor N319 that operates depending on the potential of the sensing node SO is coupled between the first and second latch circuits LC1 and LC2 and a ground terminal.

The first latch circuit LC1 used as the cache latch circuit includes a latch LAT1 and a plurality of transistors. For example, the plurality of transistors may include transistors N305, N307, N309, and TRANC. The transistor N307 is coupled between a first terminal (non-inverting terminal) of the latch LAT1 and the transistor N319 and operates in response to a reset signal CRST. The transistor N309 is coupled between a second terminal (inverting terminal) of the latch LAT1 and the transistor N319 and operates in response to a set signal CSET. The transistor N305 is coupled to the ground terminal and operates depending on voltage output to the first terminal of the latch LAT1. The transistor TRANC is coupled between the transistor N305 and the sensing node SO and operates in response to a transfer signal TRANC.

The second latch circuit LC2 used as the main latch circuit includes a latch LAT2 and a plurality of transistors. For example, the plurality of transistors may include transistors N311, N313, N315, and N317. The transistor N315 is coupled between a first terminal (non-inverting terminal) of the latch LAT2 and the transistor N319 and operates in response to a reset signal MRST. The transistor N317 is coupled between a second terminal (inverting terminal) of the latch LAT2 and the transistor N319 and operates in response to a set signal MSET. The transistor N311 is coupled between the first terminal of the latch LAT2 and the sensing node SO and operates in response to a transfer signal TRANM_N. The transistor N313 is coupled between the second terminal of the latch LAT2 and the sensing node SO and operates in response to a transfer signal TRANM.

The second latch circuit LC2 directly latches the data of the memory cell sensed through the bit line BL or latches the data to be stored in the memory cell and controls the voltage of the bit line BL in response to the latched data. The first latch circuit LC1 receives the data latched in the second latch circuit LC2 to output the latched data or latches data being input to transfer the latched data to the second latch circuit LC2.

FIGS. 4A to 4D are circuit diagrams of embodiments of the column masking circuit shown in FIG. 1.

Figure 4A:
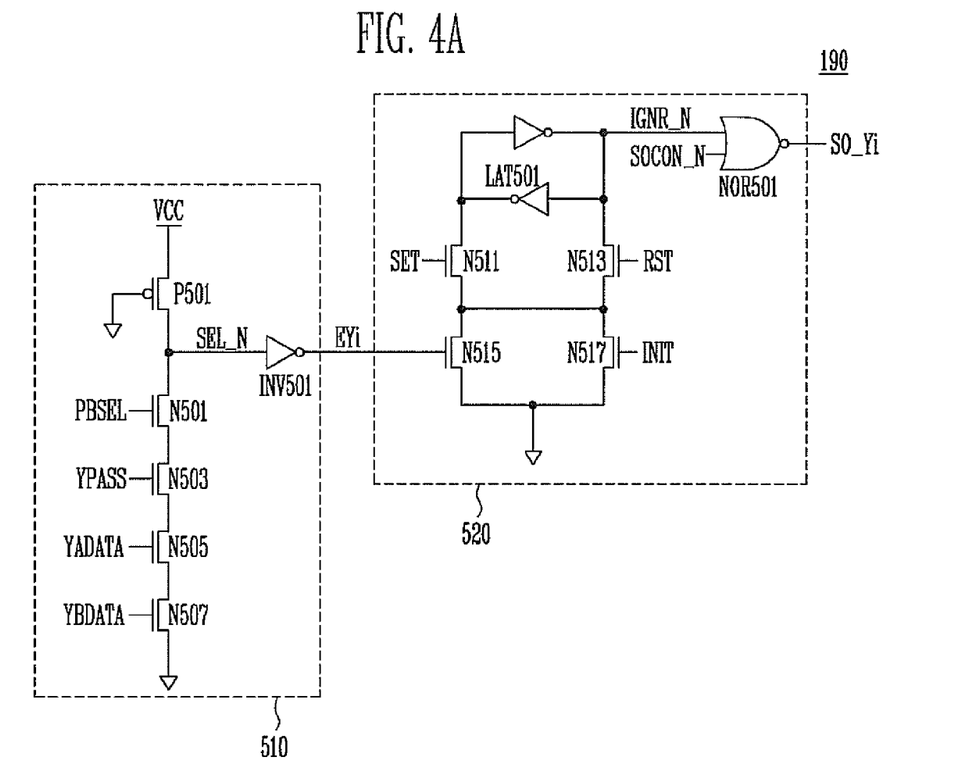
FIGS. 4A to 4D are circuit diagrams illustrating embodiments of a column masking circuit shown in FIG. 1.

Referring to FIG. 4A, a column masking circuit is configured to output a data change signal SO_Yi so as to change data output from memory cells through bit lines of unused columns among the entirety of columns into operation pass data. More specifically, the column masking circuit is configured to store column data for differentiating the unused columns from other columns and output the data change signal SO_Yi in an activated state or a deactivated state in response to the column data. The column masking circuit includes a data change control circuit 510 and a data change determination circuit 520. The number of data change control circuits 510 and the number of data change determination circuits 520 are each equal to the total number of columns.

The data change control circuit 510 is configured to output a data change control signal EYi in response to the repaired column address RCADD including a plurality of address signals PBSEL, YPASS, YADATA, and YBDATA that are coded by and output from the control circuit (see reference numeral 120 of FIG. 1). Specifically, the data change control circuit 510 includes transistors N501 to N507, a transistor P501, and an inverter INV501. The transistors N501 to N507 are coupled in series between a ground terminal and a node SEL_N and operate in response to the address signals PBSEL, YPASS, YADATA, and YBDATA. The transistor P501 is coupled between the node SEL_N and the power supply terminal VCC and receives a ground voltage. The inverter INV501 is coupled to the node SEL_N. The data change control circuit 510 is provided to each column. When an address corresponding to the column of the data change control circuit 510 coincides with the repaired column address RCADD, the transistors N501 to N507 are turned on, and the data change control signal EYi is activated to a high level.

The data change determination circuit 520 is configured to store column data in response to the data change control signal EYi and output the data change signal SO_Yi in an activated state or a deactivated state in response to the column data and an output control signal. The data change determination circuit 520 includes a latch LAT501 configured to store the column data, input circuits N515 and N511 configured to input the column data to the latch LAT501 in response to the data change control signal EYi and a set signal SET, initialization circuits N513 and N517 configured to initialize the latch LAT501 in response to a reset signal RST and an initialization signal INIT, and an output circuit NOR501 configured to output the data change signal SO_Yi in an activated state or a deactivated state in response to the output control signal and the column data stored in the latch LAT501.

The output circuit may be composed of a NOR gate NOR501 that outputs the data change signal SO_Yi in response to an inversion signal IGNR_N of the column data and an inversion signal SOCON_N of the output control signal SOCON.

Figure 4B:
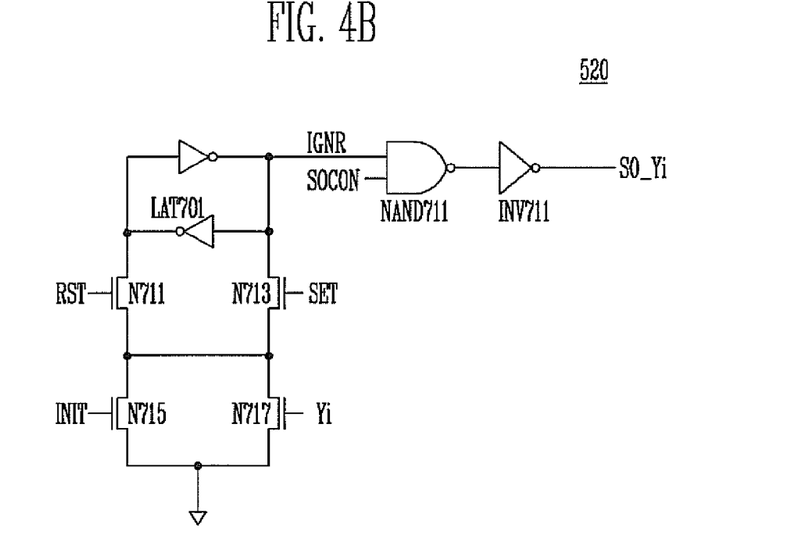

Referring to FIG. 4B, the output circuit may include a NAND gate NAND711 operating in response to column data IGNR and an output control signal SOCON and an inverter INV711 inverting a signal output from the NAND gate NAND711.

Figure 4C:
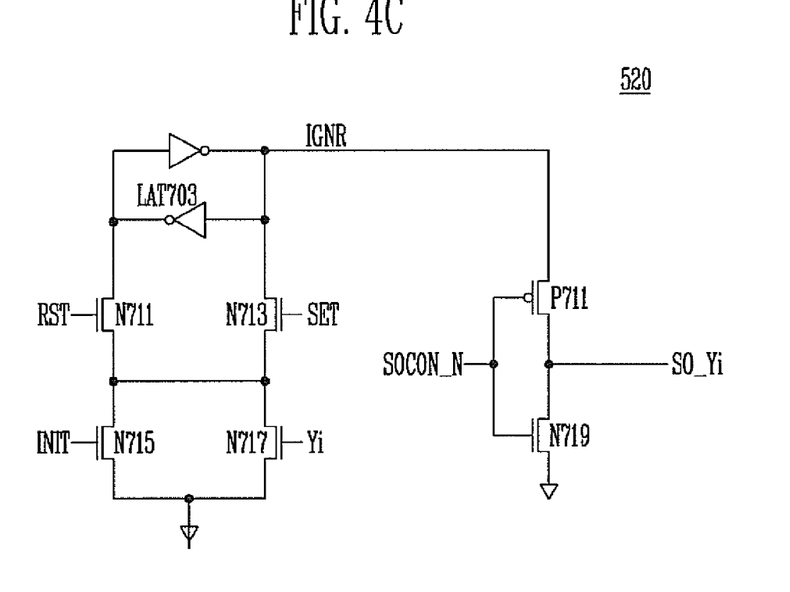

Referring to FIG. 4C, the output circuit may include a PMOS transistor P711 and an NMOS transistor N719 coupled in series between a ground terminal and a node of a latch at which the column data IGNR is output. The PMOS transistor P711 and the NMOS transistor N719 operate in response to the inversion signal SOCON_N of the output control signal SOCON. The data change signal SO_Yi is output in an activated state or a deactivated state from a connecting point of the PMOS transistor P711 and the NMOS transistor N719.

Figure 4D:
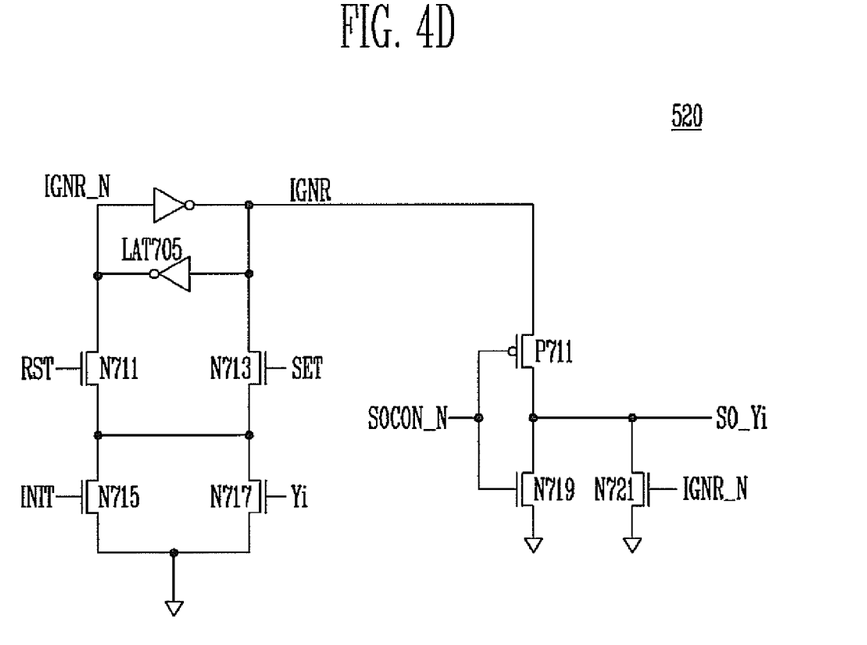

Referring to FIG. 4D, the output circuit, shown in FIG. 4C, may further include an NMOS transistor N721 coupled in parallel with the NMOS transistor N719 between the PMOS transistor P711 and the ground terminal and operating in response to the inversion signal IGNR_N of the column data IGNR.

The data change determination circuit 520 is also provided to each column. The data change determination circuit 520 latches the column data depending on whether the data change control signal EYi is in an activated state or a deactivated state and outputs the data change signal SO Yi of the corresponding column in an activated state or a deactivated state in response to the latched column data and the output control signal.

Figure 5:
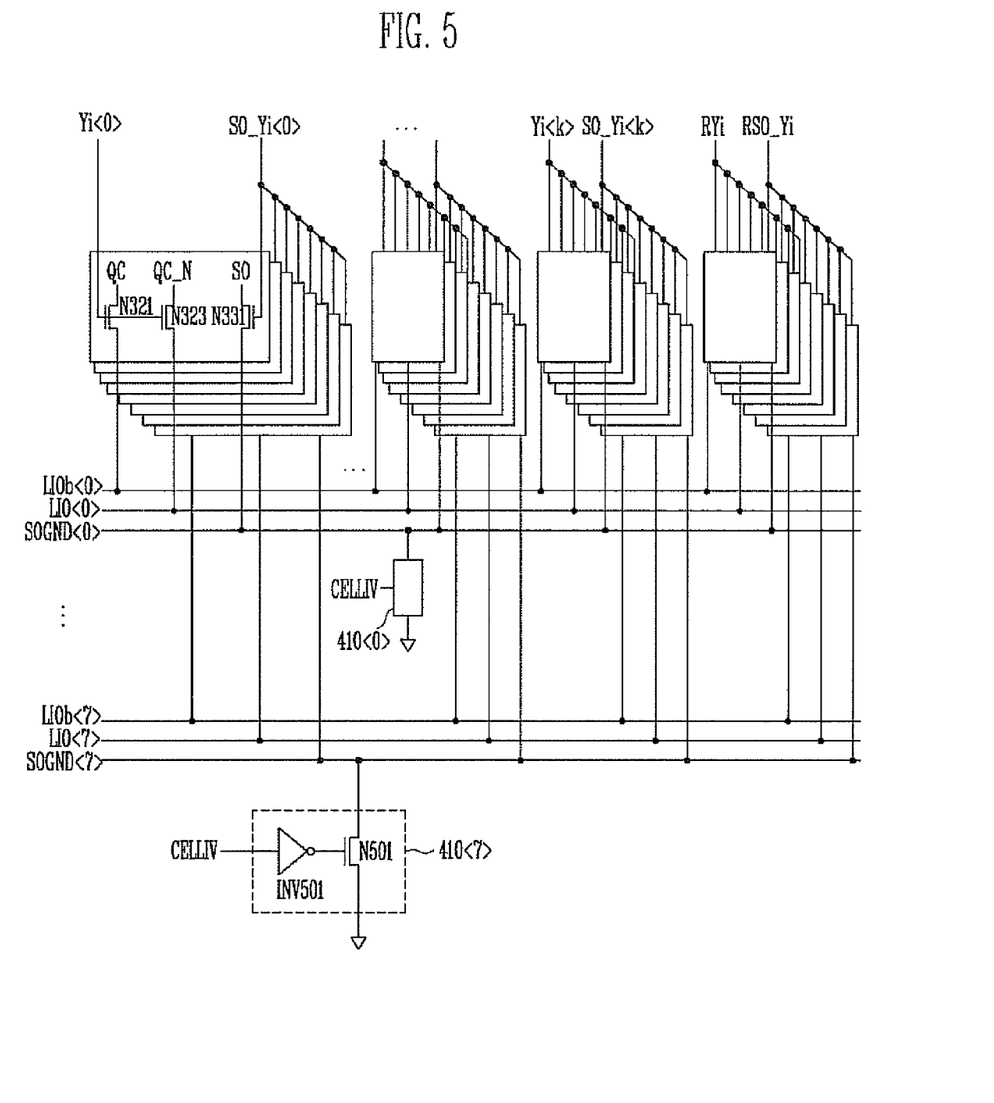
FIG. 5 is a circuit diagram of a column selector shown in FIG. 1.

FIG. 5 is a circuit diagram of the column selector shown in FIG. 1.

Referring to FIG. 5, the column selector 160 is configured to selectively transfer the data latched in the page buffers to data lines in response to address signals YI<0:k>. Specifically, the column selector is configured to change the data latched in the page buffers of the unused columns into operation pass data at the same time in response to the data change signals SO_Yi<0:k> of an activated state.

The column selector 160 includes coupling circuits N321 and N323 and data change circuits (e.g., switching circuits N331). The coupling circuits N321 and N323 are configured to selectively couple data input and output nodes QC and QC_N of the respective page buffers to data lines LIO<0> and LIOb<0> in response to column address signals (especially, coded column address signals) Yi<0:k> among the address signals. The data change circuits are configured to change the data latched in the page buffers of the unused columns into operation pass data in response to the data change signals SO_Yi<0:k>. The column selector 160 may further include a ground coupling circuit 410<0> configured to couple a ground coupling line SOGND<0> to a ground terminal in response to a ground coupling control signal CELLIV during a data change operation that changes the data latched in the page buffers of the unused columns into the operation pass data.

The data change circuits include switching circuits N331 coupled between the ground coupling line SOGND<0> and latch circuits included in the page buffers to store data therein (specifically, connecting points or sensing nodes SO of the latch circuits) and operating in response to the data change signals SO_Yi<0:k>, respectively.

The coupling circuits N321 and N323 and the data change circuits N331 are provided to each column. For example, when page buffers are divided into eight IO groups, coupling circuits included in the same IO group (i.e., coupling circuits coupled to page buffers of the same IO group) among the coupling circuits N321 and N323 are coupled to the same data line. In addition, coupling circuits that belong to different IO groups and located in the same column, among the coupling circuits N321 and N323, are configured to operate in response to the same column address signal Yi<0>).

Data change circuits that belong to the same IO group among the data change circuits N331 are coupled to the same ground coupling line (e.g., SOGND<0>), whereas data change circuits that belong to different IO groups and the same column among the data change circuits N331 are configured to operate in response to the same data change signal (e.g., SO_Yi<0>).

Hereinafter, a method of operating the semiconductor memory device having the above-described configuration will be described below.

The result of performing a status check operation (for example, a program verify operation) that checks whether a threshold voltage of a memory cell is as large as a target voltage after a program operation is performed is stored in the main latch circuit (see reference character LC2 of FIG. 3). When a memory cell has a threshold voltage smaller than the target voltage (i.e., a memory cell has not completed a program), data '1' is stored in the latch LAT2 of the second latch circuit LC2, and a high-level signal is output to the node QM.

When a memory cell has a threshold voltage larger than the target voltage (i.e., a memory cell has completed a program), data '0' is stored in the latch LAT2 of the second latch circuit LC2, and a low-level signal is output to the node QM.

The status check operation is performed to check a data value that is output to the non-inverting node QM of the latch LAT2 of each page buffer. During the status check operation, the program operation may be determined to be completed depending on whether all values output from the non-inverting nodes QM of the second latch circuits LC2 are '0' or depending on whether the number of page buffers that output data '1' is smaller than the number of bits that may be corrected by error correcting code (ECC).

In order for invalid columns (especially, columns of defective memory cells) not to affect the status check operation, the output values of the latches LAT2 included in the page buffers of the invalid columns are to be set to '0'.

As for invalid columns that are repaired since a threshold voltage of a memory cell is fixed to a certain level, when an LSB read operation is performed, data '0' is output. Here, in case of storing data of '1' in the program operation, the threshold voltage of the memory cell is to increase to the target level. However, since the threshold voltage of the memory cell is fixed to the certain level, the threshold voltage does not increase. As a result, the columns are sensed as being a fail status (i.e., a program fail status) during a status check operation that is performed after the program operation.

Therefore, a redundant data input operation is to be performed so that data latched in page buffers of invalid columns are changed into operation pass data. More specifically, a redundant data input operation is performed to input operation pass data to latch circuits (for example, column latch circuits) included in the page buffers of the invalid columns. However, during the redundant data input operation, data latched in the page buffers of the invalid columns are changed into operation pass data while the entirety of page buffers are selected in a sequential manner. Consequently, operating time is increased, and power consumption is also increased since data lines are toggled.

According to embodiments of the present invention, the column masking circuit, as shown in FIGS. 4A to 4D, is provided in each column to store column data for differentiating invalid columns, and the data latched in the page buffers of the invalid columns are simultaneously changed in to operation pass data in response to the data change signals SO_Yi<0:k> output from the column masking circuit depending on the column data, so that the redundant data input operation may be performed with less power consumption for a short period of time. This will be described below in more detail.

Figure 6:
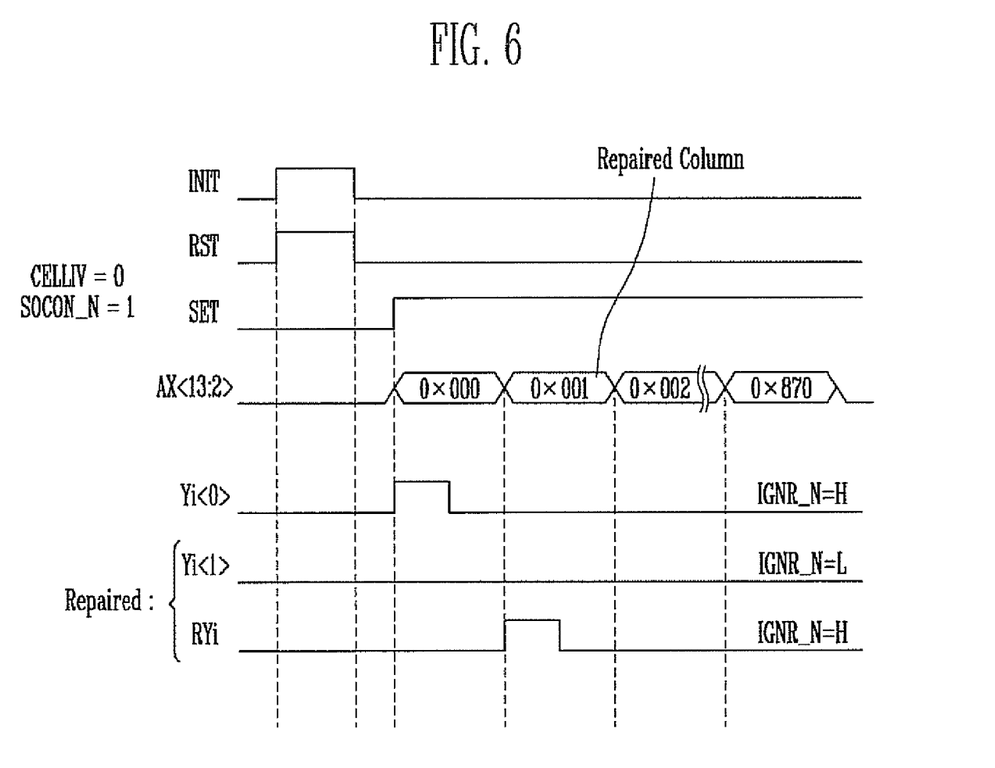
FIG. 6 is a waveform illustrating a method of operating a semiconductor memory device according to another embodiment of the present invention.

FIG. 6 is a waveform illustrating a method of operating a semiconductor memory device according to an embodiment of the present invention.

As shown in FIG. 1, the page buffer group 150 reads the configuration information RC DATA including the repaired column address RCADD from the memory block used as the CAM block and outputs the configuration information RC DATA to the control circuit 120. The control circuit 120 outputs the repaired column address RCADD to the column masking circuit 190 in response to the configuration information RC DATA.

With reference to FIGS. 4A to 4D and FIG. 6, the column masking circuit 190 initializes the latches LAT501 in response to the reset signal RST and the initialization signal INIT and stores the column data used to differentiate the invalid columns from other columns in the latches LAT201 corresponding to the respective columns in response to the data change control signal EYi generated in response to the repaired column address RCADD including the plurality of address signals PBSEL, YPASS, YADATA, and YBDATA. Here, the column masking circuit 190 selects all the columns sequentially from first to last. When columns associated with defective memory cells are selected or when columns associated with unused redundancy cells are selected, column data for differentiating the associated columns from other columns are latched in the column masking circuit of the corresponding columns.

When defective memory cells are present in the second column, high-level column data is latched in latches of the column masking circuit located in the second column, and inverting column data IGNR_N having a low level is output. In addition, low-level column data is latched in latches of the column masking circuits of columns in which redundancy cells that replace the defective memory cells are located, and the inverting column data IGNR_N having a high level is output.

The data change signal SO_Yi of each column may be output in a deactivated state by the output control signal SOCON or the inversion signal SOCON_N of the output control signal SOCON. At this time, the page buffers are not coupled to the ground coupling lines SOGND<0:k>, and the data latched in the page buffers are not changed into operation pass data. In addition, the ground coupling lines SOGND<0:k> are not coupled to the ground terminal by the ground coupling control signal CELLIV.

The above-described column data storing operation may be performed when external power starts to be applied and increases to a stable level. In addition, this column data storing operation is performed only once when external power is applied.

Subsequently, referring to FIGS. 3, 4A, and 5, the data sensed from the memory cells are stored in the latch LAT2 of the main latch circuit LC2 depending on an erase status or a program status (particularly, in response to threshold voltage levels) of the respective memory cells during a status check operation such as a verify operation performed after the program operation. Also, the transistor N311 transfers the data stored in the latch LAT2 to the sensing node SO in response to the transfer signal TRANM_N.

Subsequently, the column masking circuit outputs data change signals in an activated state and data change signals in a deactivated state in response the output signal IGNR_N from the latch LAT501 and the output control signal SOCON_N.

The column selector simultaneously couples the connecting points SO of the latch circuits, included in the page buffers of the invalid columns, to the ground coupling lines SOGND<0:7> in response to the data change signals SO_Yi<0:k> for the redundant data input operation. During the redundant data input operation, the ground coupling lines SOGND<0:7> are coupled to the ground terminal. Specifically, when the data change signals SO Yi<0:k> are input, latch circuits of page buffers that belong to different JO blocks and are located in the invalid columns are coupled to the ground coupling lines SOGND<0:7> in response to the data change signals of an activated state, among the data change signals SO_Yi<0:k>, and the data output to the sensing nodes SO are simultaneously changed into operation pass data. That is, the data transferred to the sensing nodes SO of the invalid columns are changed into operation pass data.

The sensing nodes SO of the page buffers located in normal columns are not coupled to the ground coupling lines SOGND<0:7> by the data change signals of a deactivated state.

Thus, data transferred from the main latch circuits LC1 are maintained. After the redundant data input operation is performed, data and operation pass data at the sensing nodes SO of the entirety of columns are input to the cache latch circuits LC1 of the page buffers.

The column selector sequentially couples the cache latch circuits LC1 of the page buffers included in the same IO group to the same data lines (e.g., LIO<0> and LIOb<0>) in response to the column address signals Yi<0:k>, whereas the column selector simultaneously couples the page buffers included in the different IO groups and located in the same column to the data lines LIO<0:k> and LIOb<0:k>. A check status operation is performed on the memory cells on the basis of data output to the data lines LIO<0:k> and LIOb<0:k> (i.e., data including the data sensed from the memory cells and the operation pass data).

A description has been made to a case that the data sensed from the memory cells of the invalid columns are changed into the operation pass data in response to the data change signals SO_Yi<0:k>. However, since the data change signals SO_Yi<0:k> are generated from the column data, data sensed from memory cells of invalid columns are virtually changed into operation pass data in response to column data.

As described above, data of invalid columns are changed into operation pass data, thereby preventing a program operation from being sensed as being incomplete due to the invalid columns during a status check operation. In addition, data latched in page buffers of invalid columns are simultaneously changed into operation pass data, thereby increasing operating speed and lowering power consumption.

According to embodiments of the present invention, data latched in page buffers of invalid columns coupled to defective memory cells or unused redundancy memory cells through bit lines are changed into operation pass data, so that a semiconductor memory device may be precluded from being sensed as having fail status due to the defective memory cells during a status check operation.

In addition, data latched in page buffers of invalid columns are simultaneously changed into operation pass data, thereby increasing operating speed and lowering power consumption.

What is claimed is:

1. A semiconductor memory device, comprising:
   memory blocks that each include memory cells coupled to bit lines;
   a column masking circuit configured to output data change signals in response to an address signal indicating bit lines of selected columns among a plurality of columns; and
   an operation circuit configured to store data of the memory cells transferred through the bit lines and simultaneously change data transferred through the bit lines of the selected columns into operation pass data in response to the data change signals.

2. The semiconductor memory device of claim 1, wherein the bit lines of the selected columns are coupled to a defective memory cell or a redundancy memory cell of the memory cells and the address signal includes a repaired column address.

3. The semiconductor memory device of claim 1, wherein the operation circuit is configured to read the address signal from a CAM block storing the address signal for differentiating the selected columns from other columns, among the memory blocks, when external power starts to be applied to the semiconductor memory device.

4. The semiconductor memory device of claim 2, wherein the column masking circuit is configured to store column data for differentiating the selected columns in response to the address signal and activate the data change signals in response to the column data.

5. The semiconductor memory device of claim 4, wherein after a program operation is performed to store the data in the memory cells, the column masking circuit is configured to output the data change signals in an activated state or a deactivated state before an operation of checking a status of the data stored in the memory cells is performed.

6. A method of operating a semiconductor memory device, the method comprising:
   latching column data for indicating a selected column of a plurality of columns; latching data sensed from memory cells; changing data sensed from memory cells of the selected column into operation pass data in response to the column data; and checking whether the memory cells are programmed or not by using data sensed from memory cells of remaining columns and the operation pass data, wherein the data sensed from the memory cells of the selected column are simultaneously changed into the operation pass data in response to the column data.

7. The method of claim 6, wherein the latching of the column data is performed when external power starts to be applied and subsequently increases to a stable level.

8. The method of claim 6, further comprising generating data change signals by using the column data.

9. The method of claim 8, wherein the data sensed from the memory cells of the selected column are changed into operation pass data in response to the data change signals.

10. The method of claim 6, wherein the latching of the data sensed from the memory cells is performed during a program verify operation after a program operation is performed on the memory cells.

* * * * *